(12) United States Patent
Choi et al.

(10) Patent No.: US 10,980,125 B1
(45) Date of Patent: Apr. 13, 2021

(54) PRINTED CIRCUIT BOARD

(71) Applicant: SAMSUNG ELECTRO-MECHANICS CO., LTD., Suwon-si (KR)

(72) Inventors: Jae Woong Choi, Suwon-si (KR); Ki Jung Sung, Suwon-si (KR); Tae Seong Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/794,792

(22) Filed: Feb. 19, 2020

(30) Foreign Application Priority Data

Oct. 29, 2019 (KR) ........................ 10-2019-0135147

(51) Int. Cl.
*H05K 1/18* (2006.01)
*H05K 1/11* (2006.01)
*H01L 23/00* (2006.01)

(52) U.S. Cl.
CPC ............. *H05K 1/185* (2013.01); *H01L 24/45* (2013.01); *H05K 1/115* (2013.01); *H05K 2201/086* (2013.01); *H05K 2201/10265* (2013.01)

(58) Field of Classification Search
CPC .. H05K 1/185; H05K 1/115; H05K 2201/086; H05K 2201/10265
USPC ....................................................... 361/761
See application file for complete search history.

(56) References Cited

U.S. PATENT DOCUMENTS

| | | | | |
|---|---|---|---|---|
| 2006/0145331 A1* | 7/2006 | Cho | ........................ | H01L 24/19 257/700 |
| 2008/0041619 A1* | 2/2008 | Lee | ........................ | H01L 24/24 174/260 |
| 2009/0316373 A1* | 12/2009 | Kim | ........................ | H05K 1/185 361/764 |
| 2012/0212919 A1* | 8/2012 | Mano | ................... | H05K 3/4602 361/782 |
| 2014/0034373 A1* | 2/2014 | Yoshikawa | ............ | H05K 1/165 174/260 |
| 2014/0225701 A1* | 8/2014 | Morita | ................ | H01F 17/0013 336/200 |
| 2017/0231094 A1* | 8/2017 | Blackshear | ............ | H05K 1/185 |
| 2018/0033549 A1* | 2/2018 | Taniguchi | ........... | H01F 17/0013 |
| 2018/0182532 A1* | 6/2018 | Stahr | ................... | H01F 27/2847 |
| 2018/0342342 A1* | 11/2018 | Taniguchi | ............. | H01F 41/041 |

FOREIGN PATENT DOCUMENTS

| | | |
|---|---|---|
| JP | 2017-143254 A | 8/2017 |
| KR | 10-2017-0108581 A | 9/2017 |
| KR | 10-2018-0082282 A | 7/2018 |

\* cited by examiner

*Primary Examiner* — Sherman Ng
(74) *Attorney, Agent, or Firm* — Morgan, Lewis & Bockius LLP

(57) ABSTRACT

A printed circuit board includes a first core layer having a first coil pattern disposed on one surface of the first core layer, a second core layer disposed on the one surface of the first core layer and having a first recess, a first magnetic member disposed in the first recess and including a first magnetic layer, a first insulating layer disposed between the first and second core layers, and a second insulating layer disposed on the second core layer, covering at least a portion of the first magnetic member, and disposed in at least a portion of the first recess.

19 Claims, 11 Drawing Sheets

PRINTED CIRCUIT BOARD

CROSS-REFERENCE TO RELATED APPLICATION(S)

This application claims the benefit under 35 USC 119(a) of Korean Patent Application No. 10-2019-0135147 filed on Oct. 29, 2019 in the Korean Intellectual Property Office, the entire disclosures of which are incorporated herein by reference for all purposes.

TECHNICAL FIELD

The present disclosure relates to a printed circuit board.

BACKGROUND

Central Processing Units (CPUs), Application Specific Integrated Circuits (ASICs), and Application Processors (APs) receive power from Power Management Integrated Circuits (PMICs). Recently, to improve power efficiency, the PMIC power supply switching frequency has been increased. Accordingly, a package substrate in the form of a multilayer printed circuit board having an inductor function has been required.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

An aspect of the present disclosure is to provide a printed circuit board having an inductor function, in which a high permeability may be maintained even at a high frequency.

An aspect of the present disclosure is to provide a printed circuit board in which side effects such as increasing DC resistance may be significantly reduced, while increasing inductance.

An aspect of the present disclosure is to provide a printed circuit board in which design freedom may be increased in forming a coil pattern.

According to an aspect of the present disclosure, a multilayer printed circuit board is formed to include a core structure including a plurality of core layers. One or more magnetic members may be embedded in the core structure, and one or more coil patterns may be formed in the core structure to correspond to the one or more magnetic members.

According to an aspect of the present disclosure, a printed circuit board includes a first core layer having a first coil pattern disposed on one surface of the first core layer, a second core layer disposed on the one surface of the first core layer and having a first recess, a first magnetic member disposed in the first recess and including a first magnetic layer; a first insulating layer disposed between the first and second core layers, and a second insulating layer disposed on the second core layer, covering at least a portion of the first magnetic member, and disposed in at least a portion of the first recess.

According to an aspect of the present disclosure, a printed circuit board includes a core structure in which a plurality of core layers and a plurality of insulating layers are alternately disposed, a first build-up structure disposed on one side of the core structure and including one or more insulating layers and one or more wiring layers, and a second build-up structure disposed on the other side of the core structure and including one or more insulating layers and one or more wiring layers. At least one of the plurality of core layers is provided with a coil pattern disposed on at least one surface of the at least one of the plurality of core layers. A cavity of another core layer among the plurality of core layers is provided with a magnetic member.

According to an aspect of the present disclosure, a printed circuit board includes a first core layer having a first recess, a first magnetic member disposed in the first recess and including a first magnetic layer, a second core layer having a second recess, a second magnetic member disposed in the second recess and including a second magnetic layer, and one or more planar spiral coil patterns disposed between the first magnetic member and the second magnetic member.

BRIEF DESCRIPTION OF THE DRAWINGS

The above and other aspects, features, and advantages of the present disclosure will be more clearly understood from the following detailed description, taken in conjunction with the accompanying drawings, in which.

DETAILED DESCRIPTION

Figure 1:
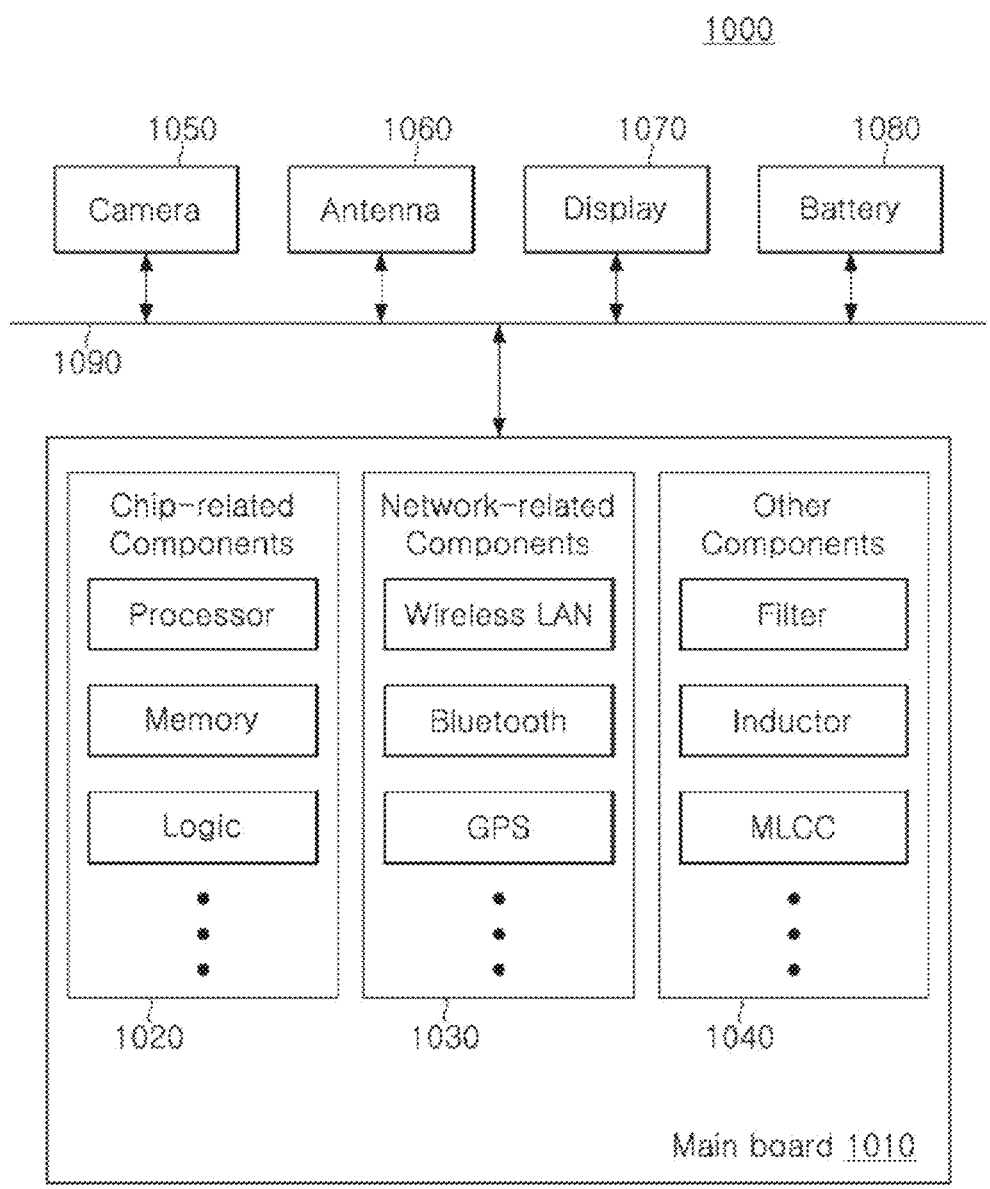
FIG. 1 is a block diagram schematically illustrating an example of an electronic system.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after gaining an understanding of the disclosure of this application. Further, although the examples described herein have a variety of configurations, other configurations are possible as will be apparent after an understanding of the disclosure of this application.

The drawings may not be to scale, and the relative size, proportions, and depiction of elements in the drawings may be exaggerated for clarity, illustration, and convenience.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other. The chip related component 1020 may be in the form of a package including the above-described chip or electronic component.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna module 1060, a display device 1070, a battery 1080, an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
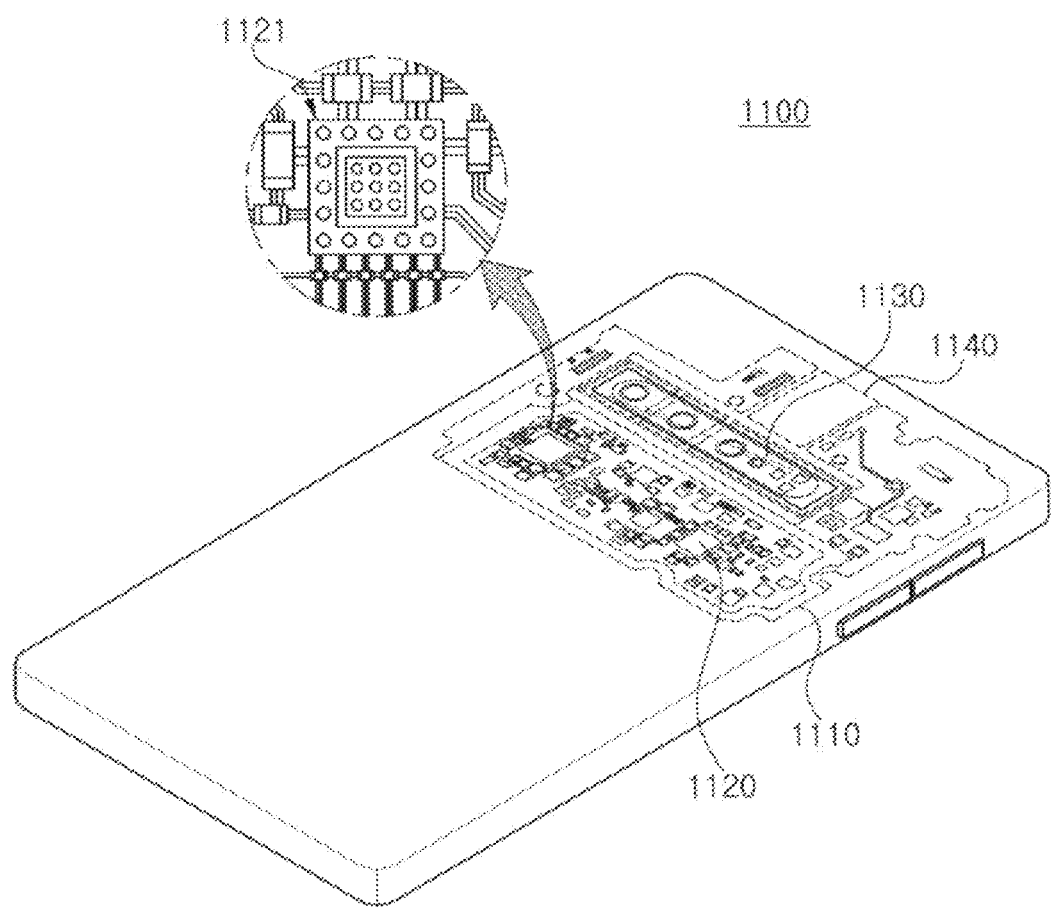
FIG. 2 is a perspective view schematically illustrating an example of an electronic device.

FIG. 2 is a schematic perspective view illustrating an example of an electronic device.

Referring to FIG. 2, an electronic device may be, for example, a smartphone 1100. A mainboard 1110 may be accommodated in the smartphone 1100, and various electronic components 1120 may be physically or electrically connected to the mainboard 1110. In addition, other electronic components that may or may not be physically or electrically connected to the mainboard 1110, such as a camera module 1130 and/or a speaker 1140, may be accommodated therein.

Some of the electronic components 1120 may be the chip related components, for example, a semiconductor package 1121, but are not limited thereto. The semiconductor package 1121 may have a form in which a semiconductor chip or a passive component is surface-mounted on a package substrate of a multilayer printed circuit board, but an embodiment thereof is not limited thereto. On the other hand, the electronic device is not necessarily limited to the smartphone 1100, and may be another electronic device as described above.

Printed Circuit Board

Figure 3:
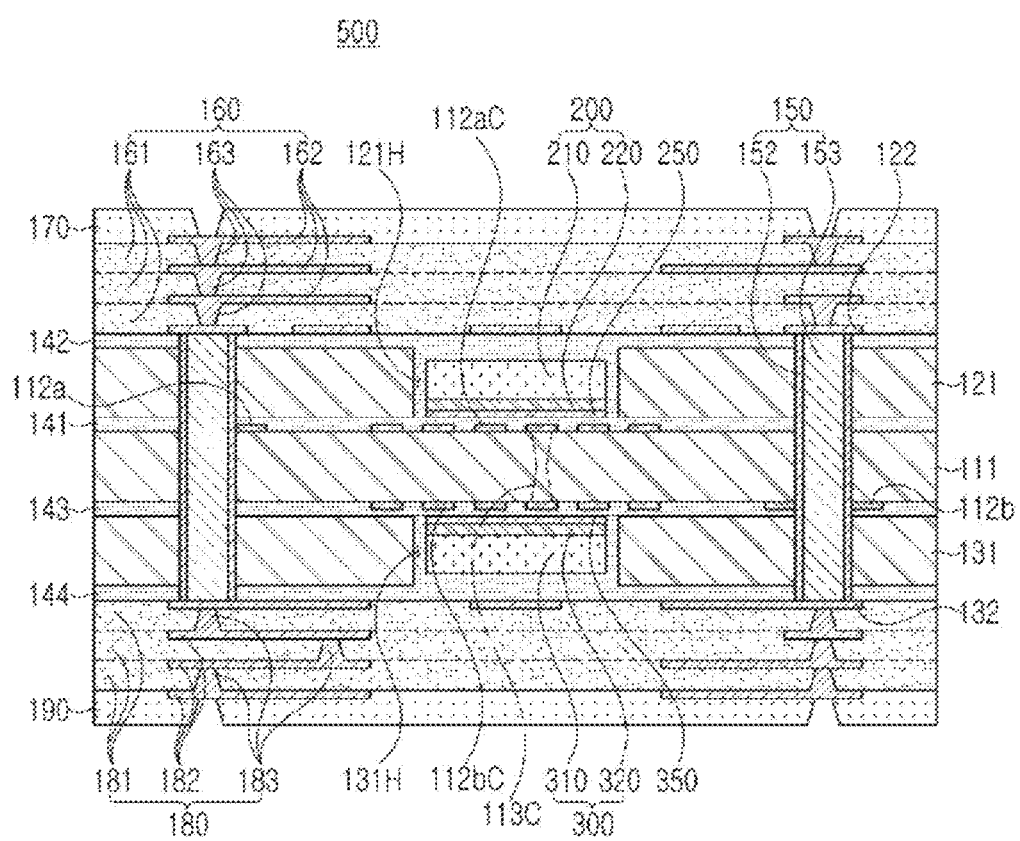
FIG. 3 is a cross-sectional view schematically illustrating an example of a printed circuit board.

FIG. 3 is a cross-sectional view schematically illustrating an example of a printed circuit board.

Figure 4:
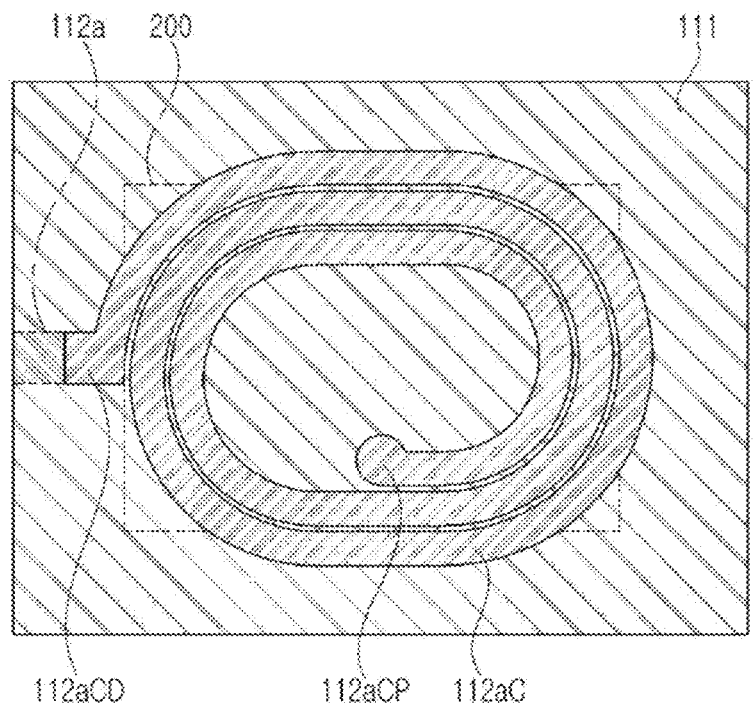
FIGS. 4 and 5 are plan views schematically illustrating examples of first and second coil patterns applied to the printed circuit board of FIG. 3.
Figure 5:
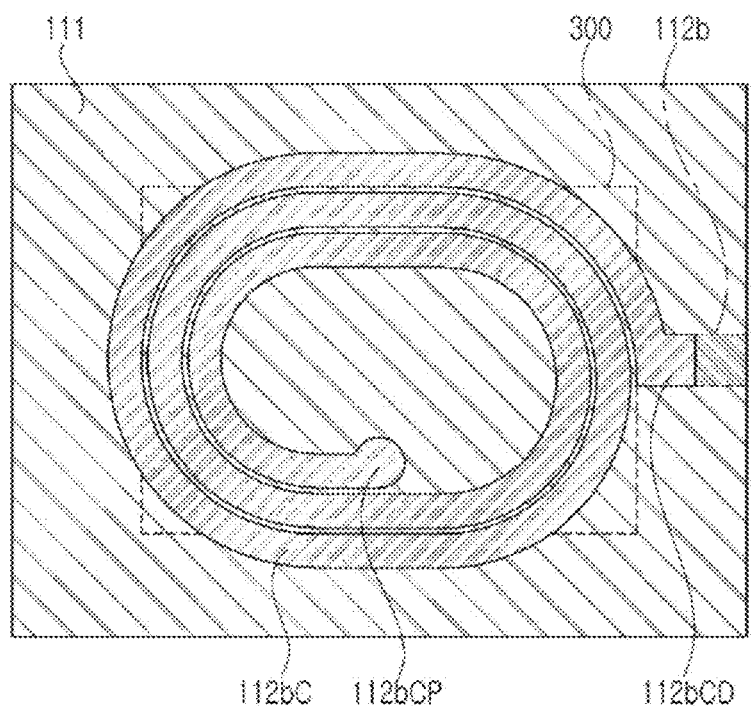

FIGS. 4 and 5 are plan views schematically illustrating examples of first and second coil patterns applied to the printed circuit board of FIG. 3.

Referring to FIGS. 3 to 5, a printed circuit board 500 according to an embodiment includes a core structure in which a plurality of core layers 111, 121 and 131 and a plurality of insulating layers 141, 142, 143 and 144 are alternately disposed; a first build-up structure 160 disposed on the core structure, and including one or more insulating layers 161, one or more wiring layers 162, and one or more via layers 163; and a second build-up structure 180 disposed below the core structure, and including one or more insulating layers 181, one or more wiring layers 182, and one or more via layers 183. In this case, first and second coil patterns 112aC and 112bC are disposed on two surfaces of the first core layer 111 among the plurality of core layers 111, 121 and 131. First and second magnetic members 200 and 300 are disposed in first and second recesses 121H and 131H of the second and third core layers 121 and 131 among the plurality of core layers 111, 121 and 131, respectively.

As described above, the CPU, the ASIC, the AP, and the like have recently been supplied with power from the PMIC. In recent years, the power supply switching frequency of the PMIC has increased to improve power efficiency. Therefore, arranging an inductor on a main board may be considered, separately from a package substrate on which an integrated circuit IC is surface-mounted. However, in this case, a high capacity inductor is required, and in detail, since an electrical path between the inductor and the integrated circuit (IC) mounted on the package substrate is increased, resistance may be increased and power efficiency may be lowered. Alternatively, simply forming a coil in a package substrate may be considered. However, in this case, since the coil is formed in air rather than in a magnetic material, it may be difficult to implement capacity. In addition, since a large area in the package substrate should be used to form a pattern coil, design freedom may be lowered. Alternatively, surface-mounting an inductor in the form of die on the bottom of a package substrate may be considered. In this case, however, the price of the inductor in the form of die may be significant.

In the case of the printed circuit board 500 according to an embodiment, the core structure includes the plurality of core layers 111, 121 and 131. In this case, the first and second magnetic members 200 and 300 are disposed in the first and second cavities 121H and 131H of the second and third core layers 121 and 131, respectively. In addition, the first and second coil patterns 112aC and 112bC are disposed on two surfaces of the first core layer 111. The first and second coil patterns 112aC and 112bC are disposed between the first and second magnetic members 200 and 300. As such, since the first and second magnetic members 200 and 300 are provided as a plurality of first and second magnetic members while being embedded, high capacity may be easily implemented. For example, the first and second magnetic members 200 and 300 may be respectively a laminate including the first and second magnetic layers 220 and 320 that may maintain high permeability at a high frequency, as described below. In addition, the first and second coil patterns 112aC and 112bC may be disposed between the first and second magnetic members 200 and 300, at a significantly reduced interval therebetween, thereby improving inductance performance. For example, the first and third insulating layers 141 and 143 may be disposed between the first and second magnetic layers 220 and 320, and the first and second coil patterns 112aC and 112bC may be disposed in such a manner that at least a portion of the first and second coil patterns 112aC and 112bC overlaps the first and second magnetic layers 220 and 320 on a plane. Accordingly, side effects such as an increase in DC resistance may be significantly reduced while increasing inductance. In addition, by utilizing dead space for warpage control of the core structure, the design freedom may be increased. In addition, since the first and second coil patterns 112aC and 112bC may be formed on the upper and lower surfaces of the first core layer 111 in planar spiral shapes, respectively, the limitation of the number of coil turns may be eliminated, and the design freedom may be increased.

Hereinafter, the components of the printed circuit board 500 will be described in detail with reference to the accompanying drawings.

The core structure may include, for example, the first core layer 111 having the first and second coil patterns 112aC and 112bC disposed on an upper surface and a lower surface thereof, respectively, the second core layer 121 disposed on the upper surface of the first core layer 111 and having a first recess 121H, the first magnetic member 200 disposed in the first recess 121H and including the first magnetic layer 220, the third core layer 131 disposed on the lower surface of the first core layer 111 and having a second recess 131H, the second magnetic member 300 disposed in the second recess 131H and including the second magnetic layer 320, the first insulating layer 141 disposed between the first and second core layers 111 and 121, the second insulating layer 142 disposed on the second core layer 121 and covering at least a portion of the first magnetic member 200 and filling at least a portion of the first recess 121H, the third insulating layer 143 disposed between the first and third core layers 111 and 131, the fourth insulating layer 144 disposed on the third core layer 131, covering at least a portion of the second magnetic member 300, and filling at least a portion of the second recess 131H, first and second wiring layers 112a and 112b disposed on the upper and lower surfaces of the first core layer 111, respectively, third and fourth wiring layers 122 and 132 disposed on the second and fourth insulating layers 142 and 144, respectively, and a through-via 150 penetrating through the first to third core layers 111, 121 and 131 and the first to third insulating layers 141, 142 and 143, and electrically connecting two or more of the first to fourth wiring layers 112a, 112b, 122 and 132 to each other.

The core layers 111, 121, and 131 may provide a core structure, which is the center of the printed circuit board 500, and may control warpage. An insulating material may be used as the material of the core layers 111, 121, and 131. In this case, the insulating material may be a thermosetting resin such as an epoxy resin, a thermoplastic resin such as polyimide, or a material including glass fiber, glass cloth or glass fabric and/or a reinforcing material such as an inorganic filler together with these resins, for example, a copper clad laminate (CCL), unclad CCL, or the like. However, embodiments thereof are not limited thereto. For example, as the core layers 111, 121 and 131, a metal plate or a glass plate may be used, or a ceramic plate may be used. If necessary, Liquid Crystal Polymer (LCP) may also be used as the material of the core layers 111, 121 and 131. The materials thereof may the same material as each other or may be different from each other.

The insulating layers 141, 142, 143, and 144 may be disposed between the core layers 111, 121 and 131 to serve as adhesive layers for laminating the core layers 111, 121 and 131, and may be provided as a material including the magnetic members 200 and 300. An insulating material may be used as the material of the insulating layers 141, 142, 143 and 144, and the insulating material may be a thermosetting resin such as epoxy resin, a thermoplastic resin such as polyimide, or a material including glass fiber, glass cloth or glass fabric and/or a reinforcing material such as an inorganic filler together with these resins, for example, a prepreg, ABF, or the like. These insulating layers 141, 142, 143 and 144 may include the same material or may include different materials. If necessary, each of the insulating layers 141, 142, 143 and 144 may be comprised of a plurality of layers, and when comprised of a plurality of layers, boundaries therebetween may be identified, or the plurality of layers may be integrated with each other to such an extent to which a boundary therebetween cannot be identified.

The thickness of each of the core layers 111, 121 and 131 may be greater than the thickness of each of the insulating layers 141, 142, 143 and 144. An elastic modulus of each of the core layers 111, 121 and 131 may be greater than an elastic modulus of each of the insulating layers 141, 142, 143 and 144. Under such conditions, the core layers 111, 121 and 131 may more effectively serve as cores for warpage control.

A metal material may be used as the material of the wiring layers 112a, 112b, 122 and 132, and the metal material may be copper (Cu), aluminum (Al), silver (Ag), tin (Sn), gold (Au), nickel (Ni), lead (Pb), titanium (Ti), alloys thereof, or the like. The wiring layers 112a, 112b, 122 and 132 may be formed by a plating process such as an additive process (AP), a semi additive process (SAP), a modified semi additive process (MSAP), or tenting (TT). As the result thereof, the wiring layers 112a, 112b, 122 and 132 may include a seed layer, which is an electroless plating layer, and an electrolytic plating layer formed based on the seed layer. The wiring layers 112a, 112b, 122 and 132 may perform various functions according to the design of the layers. For example, the wiring layers 112a, 112b, 122 and 132 may include a ground (GrouND: GND) pattern, a power (PoWeR: PWR) pattern, a signal (S) pattern, and the like. In this case, the signal (S) pattern includes various signals except for a ground GND pattern, a power PWR pattern, and the like, for example, may include a data signal and the like. If necessary, the ground GND pattern and the power PWR pattern may be the same pattern. These patterns may respectively include a line pattern, a plane pattern, and/or a pad pattern.

A metal material may also be used as the material of the coil patterns 112aC and 112bC, and the metal material may be copper (Cu), aluminum (Al), silver (Ag), tin (Sn), gold (Au), nickel (Ni), lead (Pb), titanium (Ti), alloys thereof, or the like. The coil patterns 112aC and 112bC may be simultaneously formed through the above-described plating process when the wiring layers 112a and 112b are formed. As a result, the coil patterns 112aC and 112bC may include a seed layer which is an electroless plating layer, and an electrolytic plating layer formed based on the seed layer. The coil patterns 112aC and 112bC may each have a planar spiral shape. For example, the coil patterns 112aC and 112bC may respectively be coils having a plurality of turns as viewed on the plane. Therefore, a relatively high inductance may be obtained, while implementing thinning. The coil patterns 112aC and 112bC may be electrically connected to at least portions of the wiring layers 112a and 112b on the ends 112aCD and 112bCD of the coil patterns, respectively. The coil patterns 112aC and 112bC may be electrically connected to each other through a connection via 113C penetrating through the first core layer 111 on different ends 112aCP and 112bCP thereof, respectively. The connection via 113C may be formed of the same material as that of the coil patterns 112aC and 112bC and may be formed simultaneously therewith by a plating process.

The through-via 150 provides a vertical electrical connection path within the core structure. For example, the through-via 150 may include a first through-via respectively connected to the first wiring layer 112a, the third wiring layer 122 and the fourth wiring layer 132, and a second through-via respectively connected to the second wiring layer 112b, the third wiring layer 132, the third wiring layer 122 and the fourth wiring layer 132. The through-via 150 may include a metal layer 152, and a filler 153 filling the metal layer 152. The metal layer 152 may include a metal material such as copper (Cu), aluminum (Al), silver (Ag), tin (Sn), gold (Au), nickel (Ni), lead (Pb), titanium (Ti), alloys thereof, or the like, and may also be formed by a plating process such as AP, SAP, MSAP, TT, or the like. As a result, the metal layer 152 may include a seed layer which is an electroless plating layer and an electrolytic plating layer formed based on the seed layer. The filler 153 may be, for example, a resin filler including an epoxy resin as a main component, but an embodiment thereof is not limited thereto, and various materials may be used. If necessary, the through-via 150 may be filled with the metal layer 152.

The magnetic members 200 and 300 may be in the form of a laminate including base layers 210 and 310 and magnetic layers 220 and 320 disposed on the base layers 210 and 310, respectively. Adhesives 250 and 350 may be attached to the magnetic layers 220 and 320, respectively. The magnetic layers 220 and 320 may be attached to the insulating layers 141 and 143 through the adhesives 250 and 350, respectively. If necessary, the magnetic members 200 and 300 may further include roughness reduction layers disposed between the base layers 210 and 310 and the magnetic layers 220 and 320, respectively.

The base layers 210 and 310 may serve as substrates when the magnetic layers 220 and 320 are formed. For example, the magnetic layers 220 and 320 may be formed by sputtering. Atoms or molecules protruding from a target material may be accumulated on the surfaces of the base layers 210 and 310 to form the magnetic layers 220 and 320. The base layers 210 and 310 may include an insulating material, and for example, the insulating material may be prepregs, ABFs, or the like. Alternatively, a silicon wafer formed of single crystal silicon (Si) may be used.

The magnetic layers 220 and 320 may include ferromagnetic materials to increase the magnetic field induced by the coil patterns 112*a*C and 112*b*C. For example, the magnetic layers 220 and 320 may each include a cobalt-tantalum-zirconium alloy, but the material thereof is not limited thereto. When the magnetic layers 220 and 320 include a cobalt-tantalum-zirconium alloy, the magnetic layers 220 and 320 may be formed by sputtering, and thus may be formed to have a thickness of a thin film level, for example, several micrometers. The magnetic layers 220 and 320 may be respectively formed of multiple layers or a plurality of layers. When the magnetic layers 220 and 320 are formed of a plurality of layers, the thickness of each layer may be about 0.1 to 3 μm, but is not limited thereto. On the other hand, since the magnetic layers 220 and 320 are not directly formed on the printed circuit board, the magnetic layers 220 and 320 at the thin film level may be embedded. For example, the base layers 210 and 310 are introduced into a thin film forming apparatus to form the magnetic layers 220 and 320, and then, the magnetic members 200 and 300 are cut into required sizes to be disposed in recesses 121H and 131H of the core layers 121 and 131, and therefore, may be embedded in the printed circuit board in any size without limitation according to the work size.

The adhesives 250 and 350 may be die attach films (DAFs). For example, the adhesives 250 and 350 may be epoxy resin-based adhesives, but the material thereof is not particularly limited thereto. Based on process characteristics, the lower surface of the first adhesive 250 may be coplanar with the lower surface of a second core layer 121, and the upper surface of the second adhesive 350 may be coplanar with the upper surface of the third core layer 131. "Coplanar" includes not only being completely coplanar but also substantially coplanar.

The first build-up structure 160 may include, for example, one or more fifth insulating layers 161 disposed on the second insulating layer 142, one or more fifth wiring layers 162 disposed on the one or more fifth insulating layers 161, and one or more first via layers 163 penetrating through the one or more fifth insulating layers 161, respectively. Similarly, the second build-up structure 180 may include, for example, one or more sixth insulating layers 181 disposed below the fourth insulating layer 144, one or more sixth wiring layers 182 disposed on the one or more sixth insulating layers 181, and one or more second via layers 183 penetrating through the one or more sixth insulating layers 181, respectively. The first and second build-up structures 160 and 180 may have the same number of layers, to be approximately symmetrical to each other. A first passivation layer 170 may be disposed on the first build-up structure 160. A second passivation layer 190 may be disposed below the second build-up structure 180.

The insulating layers 161 and 181 may provide insulating regions in which multilayer wirings are to be formed on both sides of the core structure. An insulating material may be used as the material of the insulating layers 161 and 181, and the insulating material may be a thermosetting resin such as epoxy resin, a thermoplastic resin such as polyimide, or a material including glass fiber and/or a reinforcing material such as an inorganic filler together with these resins, for example, a prepreg, ABF, or the like. If necessary, a Photo Imageable Dielectric (PID) may be used as the material of the insulating layers 161 and 181. The insulating layers 161 and 181 may include the same material as each other, or may include different materials. The boundary between the insulating layers 161 and 181 may be identified or may be unclear.

A metal material may be used as the material of the wiring layers 162 and 182. In this case, the metal material may be copper (Cu), aluminum (Al), silver (Ag), tin (Sn), gold (Au), nickel (Ni), lead (Pb), titanium (Ti), alloys thereof, or the like. The wiring layers 162 and 182 may be respectively formed by a plating process such as AP, SAP, MSAP, TT or the like. As the result thereof, the wiring layers 162 and 182 may include a seed layer, which is an electroless plating layer, and an electrolytic plating layer formed based on the seed layer. The wiring layers 162 and 182 may perform various functions according to the design of the layers. For example, the wiring layers 162 and 182 may include a ground (GrouND: GND) pattern, a power (PoWeR: PWR) pattern, a signal (S) pattern, and the like. In this case, the signal (S) pattern includes various signals except for a ground GND pattern, a power PWR pattern, and the like, for example, may include a data signal and the like. If necessary, the ground GND pattern and the power PWR pattern may be the same pattern. These patterns may respectively include a line pattern, a plane pattern, and/or a pad pattern.

A metal material may also be used as the material of the via layers 163 and 183. In this case, the metal material may be copper (Cu), aluminum (Al), silver (Ag), tin (Sn), gold (Au), nickel (Ni), lead (Pb), titanium (Ti), alloys thereof, or the like. The via layers 163 and 183 may also be respectively formed by a plating process such as AP, SAP, MSAP, TT or the like. As the result thereof, the via layers 163 and 183 may include a seed layer, which is an electroless plating layer, and an electrolytic plating layer formed based on the seed layer. Wiring vias of the via layers 163 and 183 may be completely filled with a metal material, respectively, or may be formed as the metal material is formed along wall surfaces of via holes. In addition, all known shapes such as a tapered shape or the like may be used. For example, the wiring via of the first via layer 163 and the wiring via of the second via layer 183 may have tapered shapes in opposite directions. The via layers 163 and 183 may also perform various functions according to the design of the layers. For example, the via layers 163 and 183 may include a wiring via for signal connection, a wiring via for ground connection, and a wiring via for power connection. The wiring via for ground connection and the wiring via for power connection may be the same wiring via.

The passivation layers 170 and 190 may protect the internal configurations of the printed circuit board 500 according to an embodiment from external physical and chemical damage. The passivation layers 170 and 190 may include a thermosetting resin. For example, the passivation layers 170 and 190 may be ABF layers, but an embodiment thereof is not limited thereto, and the passivation layers 170 and 190 may be respectively known solder resist (SR) layers. Also, the passivation layers 170 and 190 may include a PID if necessary. The passivation layers 170 and 190 may each have a plurality of openings, and the openings may expose at least portions of uppermost and lowermost wiring layers 162 and 182 of the printed circuit board 500 according to an embodiment. A surface treatment layer may be formed on the exposed surface of the wiring layer. The surface treatment layer may be formed by, for example, electrolytic gold plating, electroless gold plating, OSP or electroless tin plating, electroless silver plating, electroless nickel plating/ substituted plating, DIG plating, HASL, or the like. If necessary, each opening may be composed of a plurality of via holes. If necessary, an underbump metal (UBM) may be disposed on each opening to improve reliability.

If necessary, at least one of the second and third core layers 121 and 131 may further have a recess, and a chip capacitor may be disposed in the added recess. In this case, a printed circuit board having both an inductor function and a capacitor function may be provided.

FIGS. 6 to 12 are process diagrams schematically illustrating an example of manufacturing the printed circuit board of FIG. 3.

Figure 6:
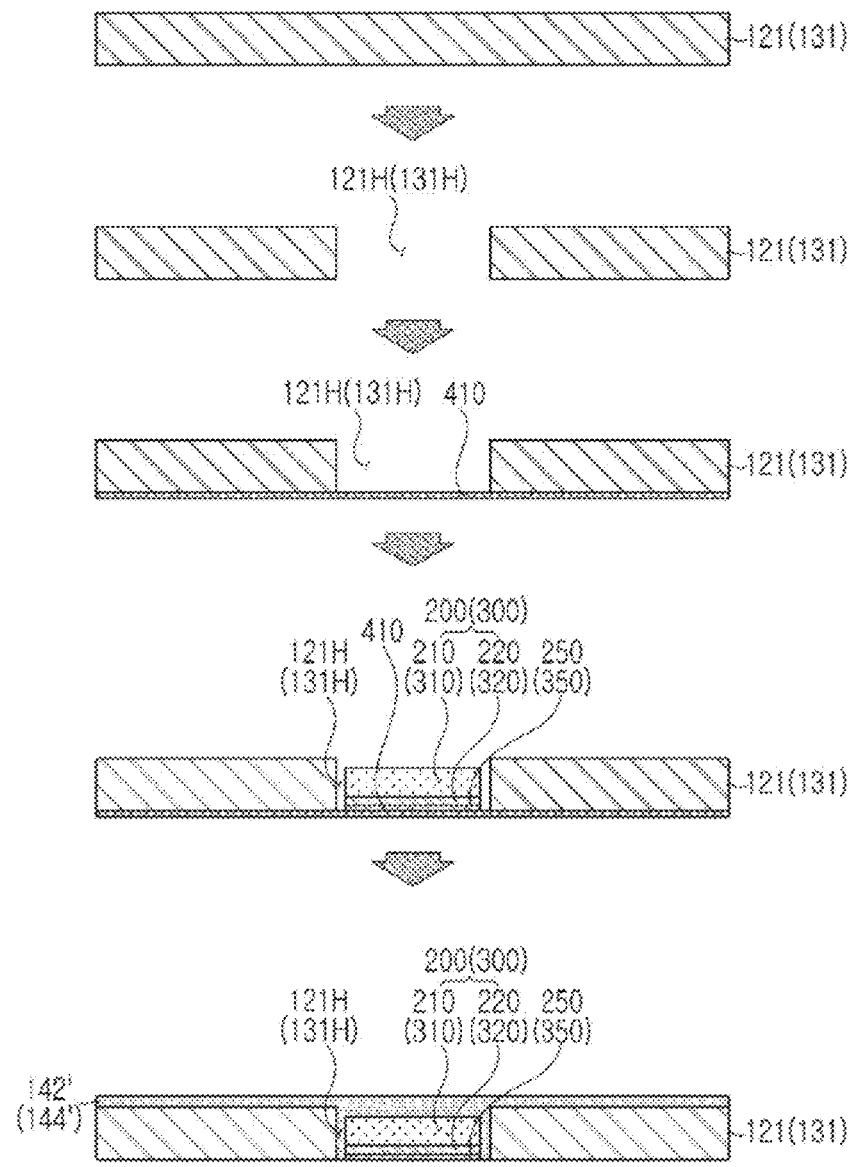
FIGS. 6 to 12 are process diagrams schematically illustrating an example of manufacturing the printed circuit board of FIG. 3.

Referring to FIG. 6, first, core layers 121 and 131 are prepared using an unclad CCL or the like. Next, recesses 121H and 131H are formed in the core layers 121 and 131 by a process such as a laser drill or a blaster. Next, a tape 410 is attached to lower sides of the core layers 121 and 131, and magnetic members 200 and 300 including base layers 210 and 310 and magnetic layers 220 and 320 are attached to upper portions of the tape 410 exposed from the recesses 121H and 131H through the adhesives 250 and 350. Next, the magnetic members 200 and 300 are embedded using insulating layers 142' and 144' such as a prepreg or ABF layer. A series of processes may be repeated to prepare a laminate for the second and third core layers 121 and 131.

Figure 7:
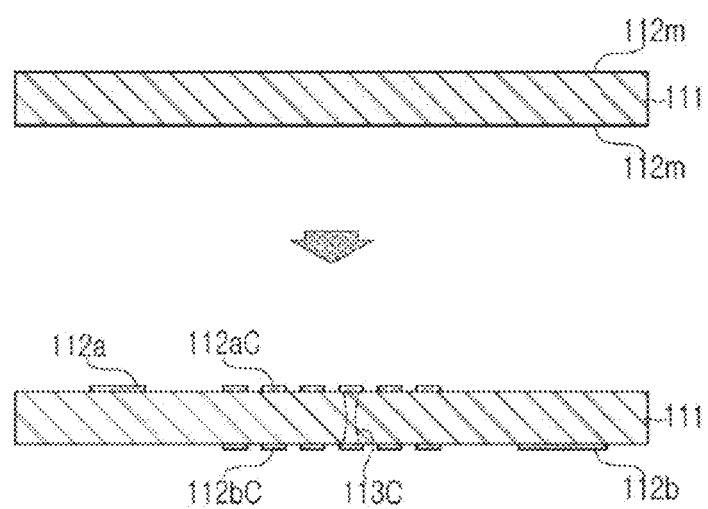
Figure 8:
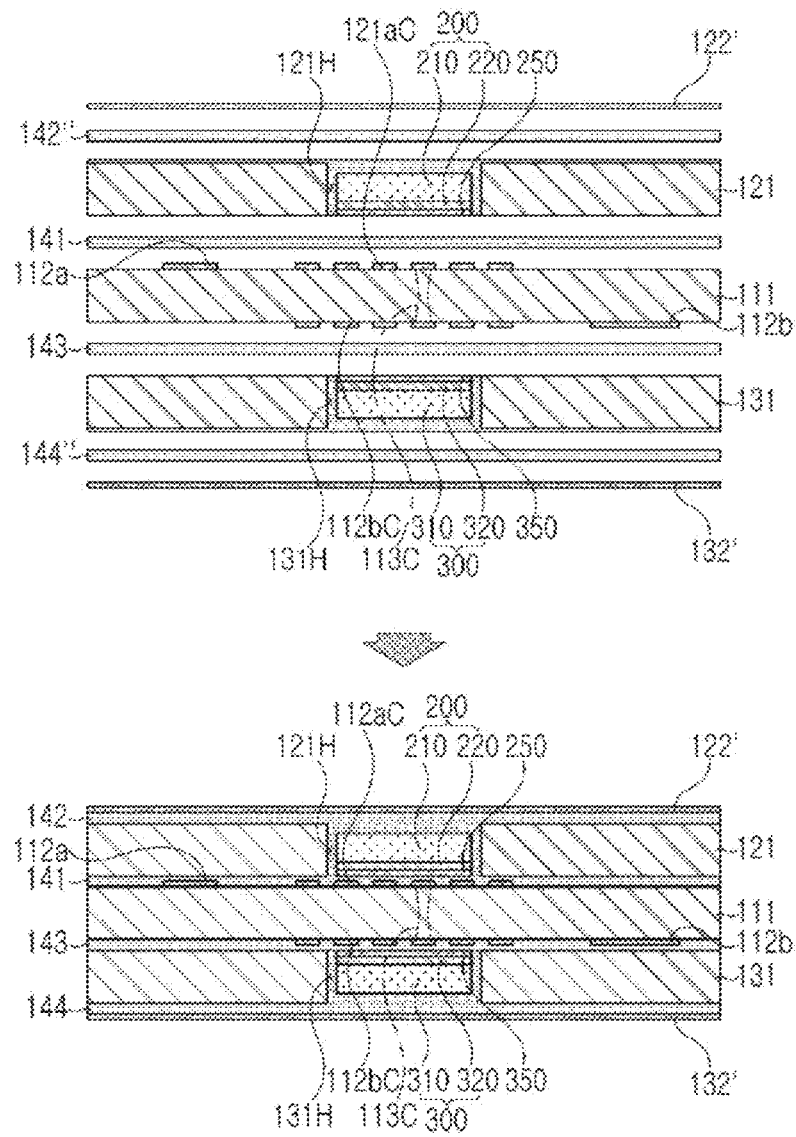
Figure 9:
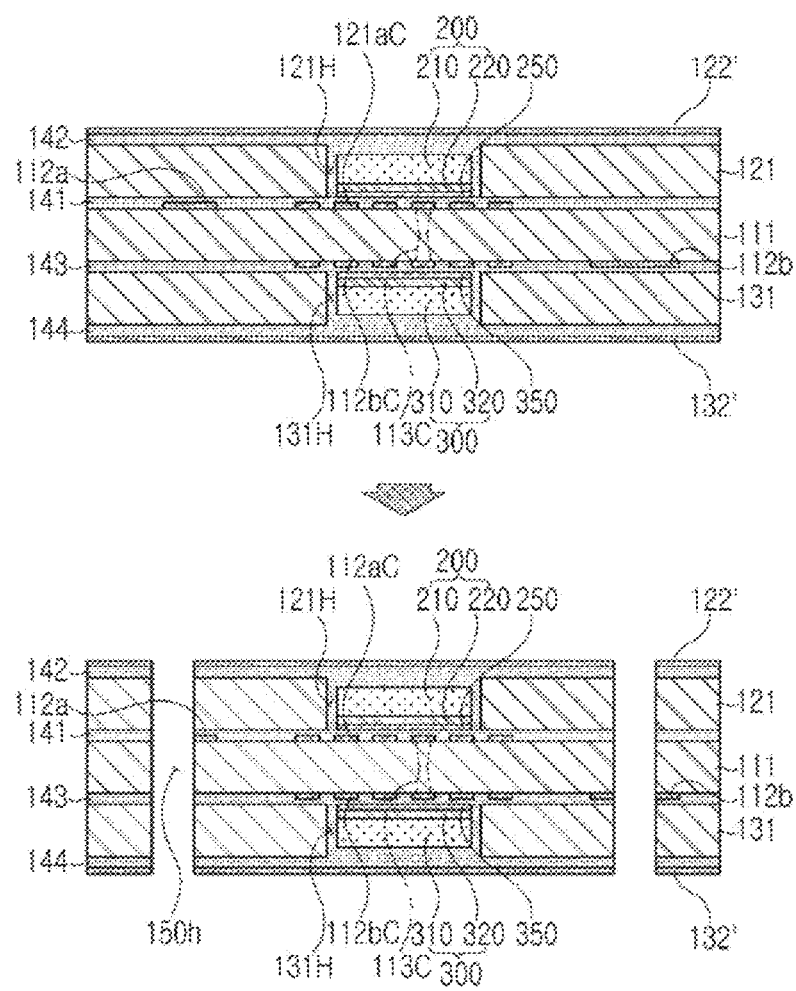
Figure 10:
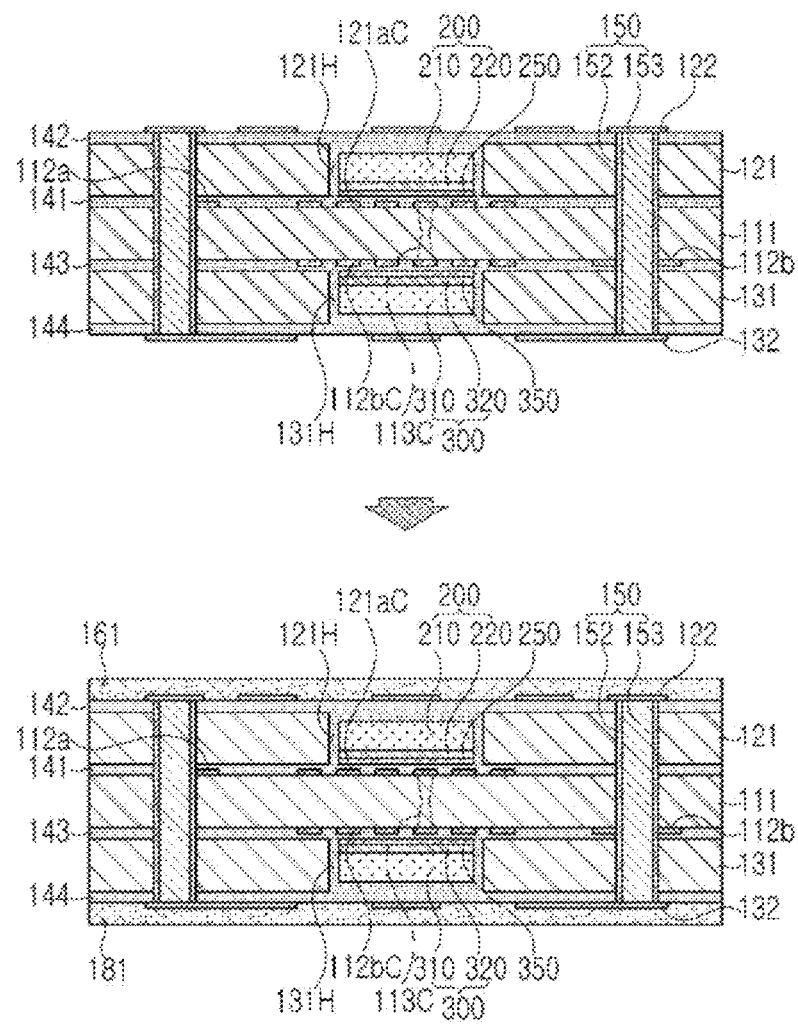
Figure 11:
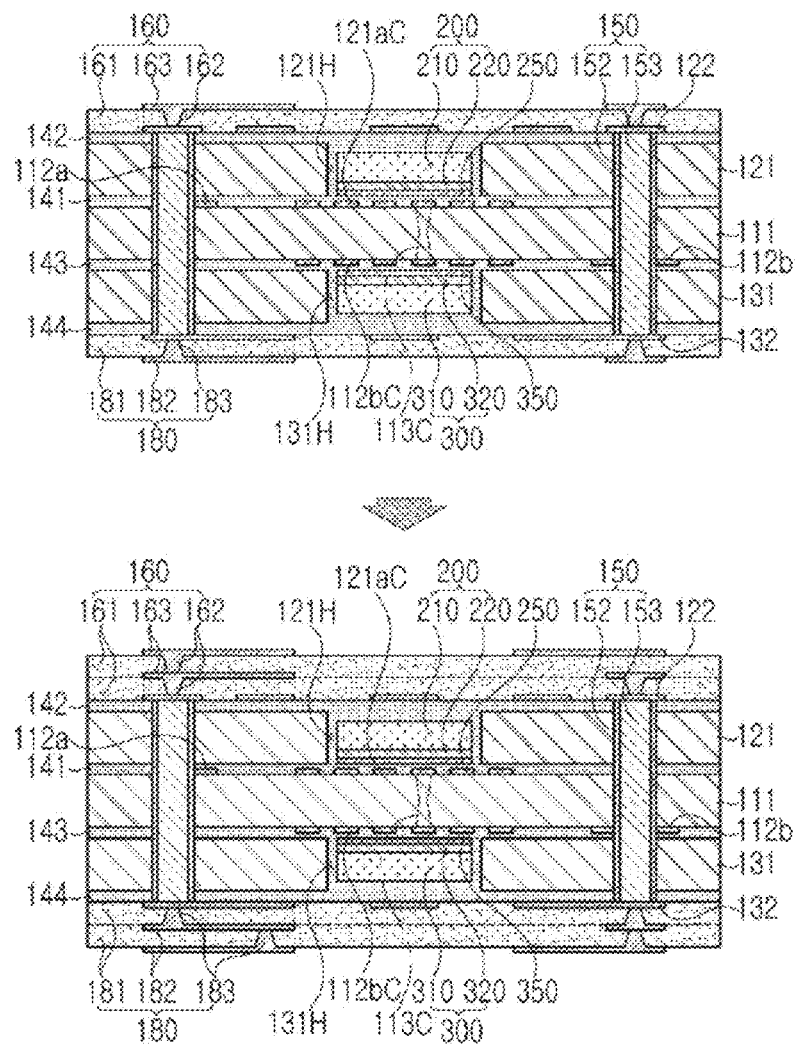
Figure 12:
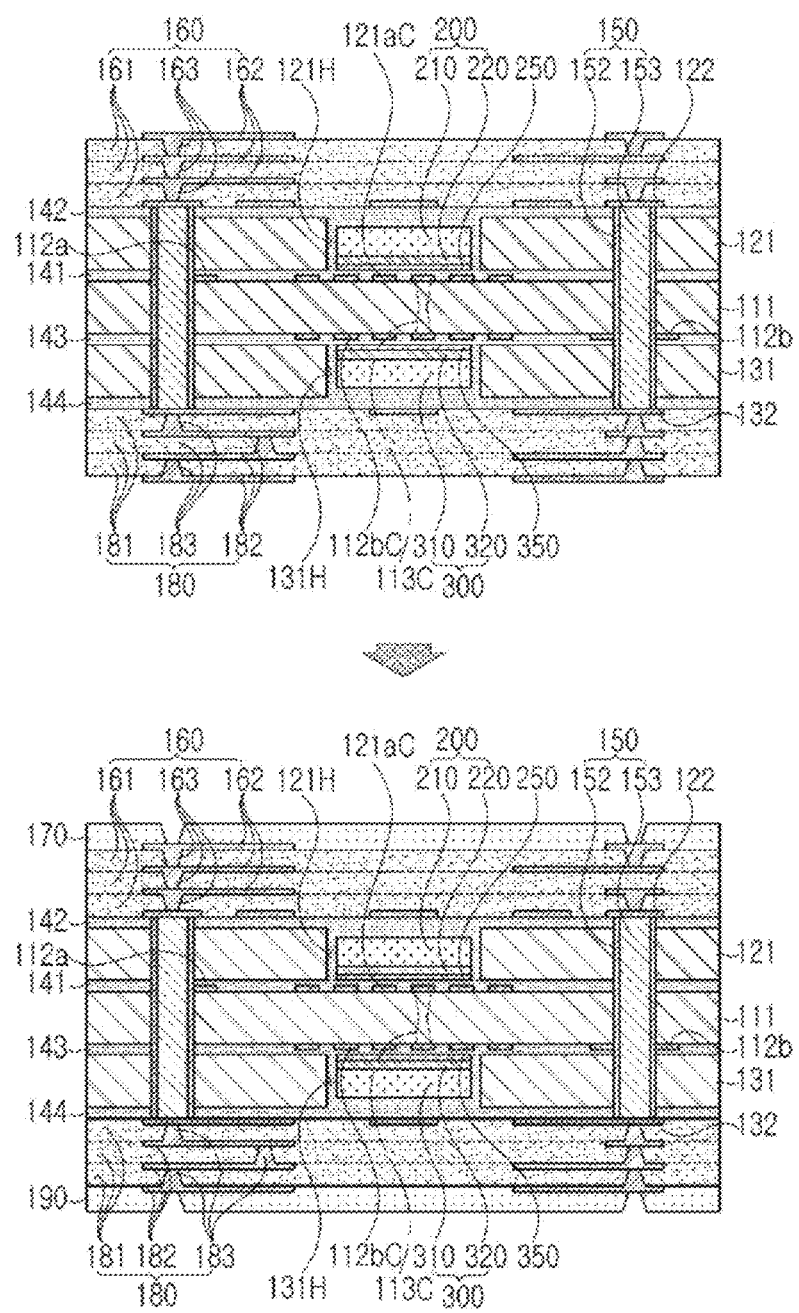

Referring to FIG. 7, first, a core layer 111 provided with copper foil 112m laminated on both surfaces thereof is prepared using a copper clad laminate or the like. Next, via holes are formed in the core layer 111 by a process such as a laser drill or a sandblaster, and wiring layers 112a and 112b, coil patterns 112aC and 112bC, and a connection via 113C are formed by a plating process. Through a series of processes, the laminate for the first core layer 111 may be prepared.

Referring to FIGS. 8 to 12, first, the previously-prepared laminates, insulating layers 142" and 144" and copper foils 122' and 132' are laminated. As the lamination process, a batch lamination process may be used. Next, a through-via hole 150h is formed by a process such as a laser drill or a mechanical drill. Next, a through-via 150 is formed by plating and filling processes, and wiring layers 122 and 132 are formed by plating processes. A core structure is formed through a series of processes. Next, insulating layers 161 and 181 are laminated on both sides of the core structure for the buildup process. Next, via holes are formed in the insulating layers 161 and 181 by a process such as a laser drill, and wiring layers 162 and 182 and via layers 163 and 183 are formed by a plating process, thereby forming build-up structures 160 and 180. This buildup process is repeated to form the build-up structures formed of a required number of layers. Next, passivation layers 170 and 190 are formed on the build-up structures 160 and 180, and openings are formed as necessary.

The above-described printed circuit board 500 may be manufactured through a series of processes.

As set forth above, according to an embodiment, a printed circuit board having an inductor function, in which a high permeability may be maintained even at a high frequency, may be provided.

A printed circuit board in which side effects such as increasing DC resistance may be significantly reduced, while increasing inductance, may be provided.

A printed circuit board in which design freedom may be increased in forming a coil pattern may be provided.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board comprising:
a first core layer having a first coil pattern disposed on one surface of the first core layer;
a second core layer disposed on the one surface of the first core layer and having a first recess;
a first magnetic member disposed in the first recess and including a first magnetic layer;
a first insulating layer disposed between the first and second core layers;
a second insulating layer disposed on the second core layer, covering at least a portion of the first magnetic member, and disposed in at least a portion of the first recess;
a third core layer disposed on the other surface of the first core layer and having a second recess;
a second magnetic member disposed in the second recess and including a second magnetic layer;
a third insulating layer disposed between the first and third core layers; and
a fourth insulating layer disposed on the third core layer, covering at least a portion of the second magnetic member, and disposed in at least a portion of the second recess,
wherein the first core layer is provided with a second coil pattern disposed on the other surface of the first core layer.

2. The printed circuit board of claim 1, wherein the first and second core layers are each thicker than the first insulating layer.

3. The printed circuit board of claim 1, wherein the first and third core layers are each thicker than the third insulating layer.

4. The printed circuit board of claim 1, wherein the first and second coil patterns are disposed between the first and second magnetic members.

5. The printed circuit board of claim 1, further comprising:
first and second wiring layers disposed on the one surface and the other surface of the first core layer, respectively;
third and fourth wiring layers disposed on the second and fourth insulating layers, respectively; and
a through-via penetrating through the first to third core layers and the first to fourth insulating layers, and connected to two or more of the first to fourth wiring layers.

6. The printed circuit board of claim 5, wherein the first coil pattern is connected to the first wiring layer, and the second coil pattern is connected to the second wiring layer.

7. The printed circuit board of claim 5, wherein the through-via comprises a first through-via respectively connected to the first wiring layer, the third wiring layer, and the fourth wiring layer, and a second through-via respectively connected to the second wiring layer, the third wiring layer, and the fourth wiring layer.

8. The printed circuit board of claim 1, wherein the first and second coil patterns each have a planar spiral shape.

9. The printed circuit board of claim 1, wherein the first and second coil patterns are connected to each other through a connection via penetrating through the first core layer.

10. The printed circuit board of claim 1, wherein the first magnetic member comprises a first base layer and the first magnetic layer disposed on the first base layer, and
the second magnetic member comprises a second base layer and the second magnetic layer disposed on the second base layer.

11. The printed circuit board of claim 10, wherein the first magnetic layer is attached to the first insulating layer through a first adhesive, and
the second magnetic layer is attached to the third insulating layer through a second adhesive.

12. The printed circuit board of claim 10, wherein the first and second base layers are each a substrate including silicon (Si).

13. The printed circuit board of claim 10, wherein the first and second magnetic layers each comprise a cobalt-tantalum-zirconium alloy.

14. The printed circuit board of claim 1, further comprising:
one or more fifth insulating layers disposed on one side of the second insulating layer;
one or more sixth insulating layers disposed on one side of the fourth insulating layer;
one or more fifth wiring layers disposed on the one or more fifth insulating layers, respectively;
one or more sixth wiring layers disposed on the one or more sixth insulating layers, respectively;
one or more first via layers penetrating through the one or more fifth insulating layers, respectively;
one or more second via layers penetrating through the one or more sixth insulating layers, respectively;
a first passivation layer disposed on one side of the one or more fifth insulating layers; and
a second passivation layer disposed on one side of the one or more sixth insulating layers.

15. A printed circuit board comprising:
a core structure in which a plurality of core layers including a first core layer, a second core layer, and a third core layer and a plurality of insulating layers are alternately disposed;
a first build-up structure disposed on one side of the core structure and including one or more insulating layers and one or more wiring layers; and
a second build-up structure disposed on the other side of the core structure and including one or more insulating layers and one or more wiring layers,
wherein the first core layer is provided with a coil pattern disposed on at least one surface of the first core layer,
a first cavity of the second core layer is provided with a first magnetic member,
a second cavity of the third core layer is provided with a second magnetic member, and
the coil pattern is disposed between the first magnetic member and the second magnetic member.

16. The printed circuit board of claim 15, wherein a thickness of each of the plurality of core layers is greater than a thickness of each of the plurality of insulating layers included in the core structure and a thickness of each of the one or more insulating layers included in the first and second build-up structures.

17. A printed circuit board comprising:
a first core layer having a first recess;
a first magnetic member disposed in the first recess and including a first magnetic layer;
a second core layer having a second recess;
a second magnetic member disposed in the second recess and including a second magnetic layer; and
one or more planar spiral coil patterns disposed between the first magnetic member and the second magnetic member.

18. The printed circuit board of claim 17, further comprising:
a wiring layer disposed between the first core layer and the second core layer, and extending from an end of the one or more planar spiral coil patterns.

19. The printed circuit board of claim 17, further comprising:
a first build-up structure including one or more insulating layers and one or more wiring layers; and
a second build-up structure including one or more insulating layers and one or more wiring layers,
wherein the first core layer is disposed between the first build-up structure and the second core layer,
the second core layer is disposed between the second build-up structure and the first core layer, and
a thickness of each of the first and second core layers is greater than a thickness of each of the one or more insulating layers included in the first and second build-up structures.

* * * * *